United States Patent
Yamada et al.

(10) Patent No.: US 7,663,252 B2
(45) Date of Patent: Feb. 16, 2010

(54) ELECTRIC POWER SEMICONDUCTOR DEVICE

(75) Inventors: Junji Yamada, Tokyo (JP); Seiji Saiki, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/873,030

(22) Filed: Oct. 16, 2007

(65) Prior Publication Data

US 2008/0164621 A1  Jul. 10, 2008

Related U.S. Application Data

(62) Division of application No. 10/648,347, filed on Aug. 27, 2003, now Pat. No. 7,291,928.

(30) Foreign Application Priority Data

Aug. 30, 2002 (JP) .............................. 2002-253668

(51) Int. Cl.
*H01L 23/48* (2006.01)
*H01L 23/52* (2006.01)
*H01L 29/40* (2006.01)

(52) U.S. Cl. ....................................... 257/784
(58) Field of Classification Search ......... 257/666–677, 257/678–733, 777, 735, 784, 785; 438/6, 438/28, 66, 67, 107, 109, 406, 455–459

See application file for complete search history.

(56) References Cited

U.S. PATENT DOCUMENTS

| 5,402,318 | A | 3/1995 | Otsuka et al. | |
|---|---|---|---|---|
| 5,422,435 | A * | 6/1995 | Takiar et al. | 174/521 |
| 6,054,754 | A | 4/2000 | Bissey | |
| 6,184,574 | B1 | 2/2001 | Bissey | |
| 6,310,388 | B1 | 10/2001 | Bissey | |
| 6,836,006 | B2 * | 12/2004 | Muto et al. | 257/686 |

FOREIGN PATENT DOCUMENTS

| JP | 8-264596 | 10/1996 |
|---|---|---|
| JP | 2000-164800 | 6/2000 |
| JP | 2000-323647 | 11/2000 |
| JP | 2002-134552 | 5/2002 |
| JP | 2003-133515 | 5/2003 |

* cited by examiner

*Primary Examiner*—Dao H Nguyen
*Assistant Examiner*—Tram H Nguyen
(74) *Attorney, Agent, or Firm*—Oblon, Spivak, McClelland, Maier & Neustadt, L.L.P.

(57) ABSTRACT

An electric power semiconductor device including first and second circuit patterns formed on main surfaces of first and second insulating substrates, respectively, first and second semiconductor chips mounted on the first and second circuit patterns, respectively, a multilayer electrode plate assembly disposed between the first and second insulating substrates, having first, second and third electrode terminals provided with a distance from each other, a first connecting conductor made by wire bonding for connecting the first and second semiconductor chips to the first and second electrode terminals, and a second connecting conductor having an extending portion extended from a part of the third electrode terminal to be connected to the second circuit pattern, and the connection between the extending portion of the third electrode terminal and the second circuit pattern is implemented by a solder.

4 Claims, 3 Drawing Sheets

ELECTRIC POWER SEMICONDUCTOR DEVICE

CROSS-REFERENCE TO RELATED APPLICATIONS

This application is a divisional of application Ser. No. 10/648,347, filed Aug. 27, 2003 and claim priority to Japanese Patent Application No. 2002-253668, filed Aug. 30, 2002, the entire contents of which are incorporated herein by reference.

BACKGROUND OF THE INVENTION

1. Field of the Invention

The present invention relates to an electric power semiconductor device used in, for example, a motor control or an inverter, and more particularly relates to an electric power semiconductor device in which a heat release characteristic is improved, facilitating connection to an outer conducting plate, and realizing miniaturization and implementation of high capacity.

2. Description of the Prior Art

In general, an electric power semiconductor device (also, referred to as "a semiconductor power module" hereinafter) converts an input direct current to an alternate current output of certain frequency using a semiconductor, which is used in a motor control, an inverter according to various kinds of usage, an uninterruptible power source (UPS) or the like.

Conventionally, as a semiconductor device having a plurality of IC chips mounted on a package, there is disclosed a device in which a relay electrode plate portion is provided in a middle section of the device and IC chips are electrically connected to each other and to the outside through the relay electrode plate portion (referring to e.g. Japanese Patent Laid-Open Publication No. 8-264596.

In addition, there is disclosed a constitution in which an electrode plate is symmetric about a center line of the electrode plate on a substrate (referring to e.g. Japanese Patent Laid-Open Publication No. 2000-323647.

FIGS. 3 and 4 are a plan view and a partially side sectional view, respectively showing a semiconductor power module 10 described in the Japanese Patent Laid-Open Publication No. 2003-133515 which was suggested by the present inventors. As shown in FIGS. 3 and 4, reference numerals 2a and 2b designate a pair of right and left dye pad insulating substrates on which a plurality of IC chips are mounted, reference numerals 3a and 3b designate circuit patterns formed on the dye pad insulating substrates, reference numerals 4a and 4b designate semiconductor chips mounted on the circuit patterns 3a and 3b, reference numeral 6 designates a multilayer electrode plate assembly. The multilayer electrode plate assembly 6 comprises three layered electrode terminal plates 6a, 6b and 6c, and insulating layers 7a, 7b and 7c interposed between the electrode terminal plates 6a, 6b and 6c, respectively. Reference numeral 11 designates a metal base for cooling and reference numerals 21a, 21b, 22a and 22b designate metal wires.

As shown in FIGS. 3 and 4, the insulating substrates 2a and 2b are fixed to the metal base 11 for cooling and the circuit patterns 3a and 3b are fixed to the surfaces of the insulating substrates. The plural semiconductor chips 4a and 4b are connected onto the circuit patterns 3a and 3b by soldering or the like. The semiconductor chips 4a and 4b are arranged along a pair of opposite side lines of the quadrate metal base 11 for cooling which extends in a longitudinal direction in the drawing. The multilayer electrode plate assembly 6 is disposed between the two arrays of the semiconductor chips 4a and 4b along the above pair of opposite side lines. The semiconductor chips 4a and 4b are electrically connected to each other through the three layered electrode terminal plates 6a, 6b and 6c formed on the die pad insulating substrates.

FIG. 4 is a side view showing a structure of the multilayer electrode plate assembly 6 and a state of the connection between the semiconductor chips 4a and 4b. Each terminal of the semiconductor chips 4a and 4b and circuit patterns 3a and 3b are connected to the three electrode terminal plates 6a, 6b and 6c. More specifically, the wires 21a and 21b connect the electrode terminal plates 6a and 6b to the semiconductor chips 4a and 4b, respectively, by wire bonding, and the wires 22a and 22b connect the electrode terminal plates 6b and 6c to the semiconductor chips 3a and 3b, respectively, by wire bonding.

When the semiconductor module is assembled, in the first step, the wires 22a and 22b are provided so that the electrode terminal plates 6b and 6c are electrically connected to the semiconductor chips 3a and 3b through the wires 22a and 22b, respectively. Then, the wires 21a and 21b are provided so that the electrode terminal plates 6a and 6b are connected to the semiconductor chips 4a and 4b through the wires 21a and 21b, respectively. The electrode terminal plates 6a, 6b and 6c form a laminated structure together with the insulating layers 7a, 7b and 7c alternately disposed under the electrode terminal plates 6a, 6b and 6c which are insulated by the insulating layers 7a, 7b and 7c to each other.

The electrode terminal plates 6a, 6b and 6c extend outside a resin case (not shown) and form an external connecting main circuit terminals such as a P terminal, an N terminal, an alternate current terminal or the like (not shown) on the semiconductor power module 10, respectively. In addition, an internal space surrounded by the resin case is filled with a filling material such as silicon gel.

In this conventional semiconductor power module 10 having such an inner structure, since the multilayer electrode plate assembly 6 has the laminated structure, mutual inductance between the electrode terminal plates 6a, 6b and 6c is reduced as much as possible, and suppressing damages which may be caused when the semiconductor power module 10 is started or shut off, or caused by reverse inductive electromotive force when a voltage is varied.

However, in the above conventional semiconductor power module, as shown in FIG. 4, since the wires 21a and 21b and the wires 22a and 22b are adjacently provided, there is a limit in number of the wires which can be provided in a predetermined region. As a result, there arise a problem such that current flowing in one wire is increased and heat is generated in the wire or a voltage drop is caused in the wire.

Furthermore, in the case where a large-sized semiconductor power module is assembled, the number of wires is further increased and the time necessary for the wiring is increased, which reduces production efficiency to be a problem.

SUMMARY OF THE INVENTION

The present invention has been made so as to solve the above problems and it is an essential object of the present invention to provide a semiconductor power module in which heat generation or voltage drop in a wire is suppressed with improvement of the production efficiency.

In order to attain the above object, according to a semiconductor power module of the present invention, a part of electric connection by wire bonding using wires in a conventional constitution is replaced with a constitution of terminal plate connection in which an electrode terminal plate is extended to be connected to a circuit pattern directly. In other words, according to the present invention, there is used an electric connection constitution by wire bonding using a wire together with an electric connection constitution using an extended electrode terminal plate which is directly connected to the circuit pattern by a solder. In this arrangement, the connection between a semiconductor chip and an electrode terminal is implemented by the wire bonding which is positioned above the connection position of the extended electrode terminal plate with a space.

According to a first aspect of the present invention, an electric power semiconductor device includes: a circuit pattern formed on a main surface of an insulating substrate; a semiconductor chip mounted on the circuit pattern; and an electrode plate assembly formed near the circuit pattern, having a first electrode terminal provided at a predetermined position thereof and a second electrode terminal disposed below the first electrode terminal. The semiconductor device further includes a first connecting conductor made by wire bonding for connecting the semiconductor chip to the first electrode terminal, and a second connecting conductor having an extending portion extended from a part of the second electrode terminal to be connected to the circuit pattern. The second connecting conductor is provided below the first connecting conductor with a space therefrom, and the connection between the extending portion of the second electrode terminal and the circuit pattern is implemented by a solder.

According to a second aspect of the present invention, an electric power semiconductor device includes: first and second circuit patterns formed on main surfaces of first and second insulating substrates, respectively; first and second semiconductor chips mounted on the first and second circuit patterns, respectively; and a multilayer electrode plate assembly disposed between the first and second insulating substrates, having first, second and third electrode terminals provided with a distance from each other. The semiconductor device further includes a first connecting conductor made by wire bonding for connecting the first and second semiconductor chips to the first and second electrode terminals, and a second connecting conductor having an extending portion extended from a part of the third electrode terminal to be connected to the second circuit pattern. The connection between the extending portion of the third electrode terminal and the second circuit pattern is implemented by a solder.

According to a third aspect of the present invention, an electric power semiconductor device includes first and second circuit patterns formed on main surfaces of first and second insulating substrates, respectively. First and second semiconductor chips are mounted on the first and second circuit patterns, respectively, and an electrode terminal disposed between the first and second insulating substrates. The power semiconductor device further includes a connecting conductor for connecting between the electrode terminal and the first circuit pattern and a bonding wire for connecting between the electrode terminal and the second semiconductor chip. In this construction, the connecting conductor is formed of an extending portion extended from a part of the electrode terminal, and one end portion of the extending portion is connected to the first circuit pattern by a solder.

According to a fourth aspect of the present invention, an electric power semiconductor device includes: first and second circuit patterns formed on main surfaces of first and second insulating substrates, respectively. First and second semiconductor chips are mounted on the first and second circuit patterns, respectively. First, second and third electrode terminals are laminated from an upper position to a lower position in this order, and disposed between the first and second insulating substrates. The power semiconductor device further includes: a first bonding wire for connecting between the first semiconductor chip and the first electrode terminal; a second bonding wire for connecting between the second semiconductor chip and the second electrode terminal; a first connecting conductor for connecting between the second electrode terminal and the first circuit pattern; and a second connecting conductor for connecting between the third electrode terminal and the second circuit pattern. In this construction, the first connecting conductor is formed of a first extending portion extended from a part of the second electrode terminal, and the second connecting conductor is formed of a second extending portion extended from a part of the third electrode terminal, and one end portion of the first extending portion is connected to the first circuit pattern by a solder, and one end portion of the second extending portion is connected to the second circuit pattern by a solder.

BRIEF DESCRIPTION OF THE DRAWINGS

These and other objects and features of the present invention will be readily understood from the following detailed description taken in conjunction with preferred embodiments thereof with reference to the accompanying drawings, in which:

FIGS. 2A and 2B are partially side sectional views each showing an inner structure of a semiconductor power module according to another embodiment of the present invention, in which FIG. 2A illustrates a left side thereof and FIG. 2B illustrates a right side thereof;

DESCRIPTION OF THE PREFERRED EMBODIMENTS

Figure 1:
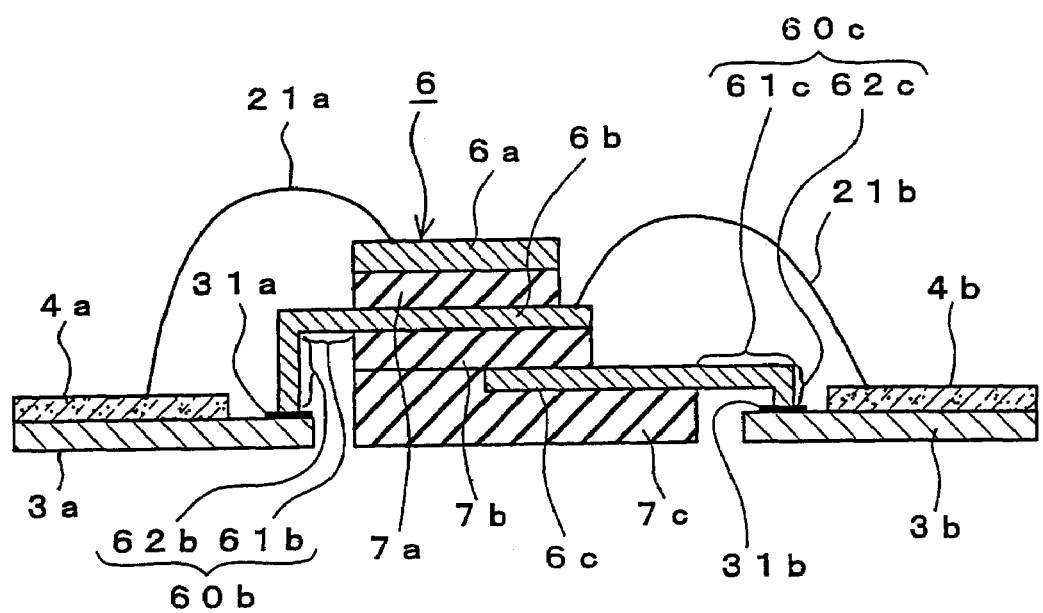
FIG. 1 is a partially side sectional view showing an inner structure of a semiconductor power module according to an embodiment 1 of the present invention.

Hereinafter, embodiments of the present invention will be described with reference to the accompanying drawings. However, although an illustrated semiconductor power module is used in the embodiments of the present invention, the present invention is not limited to this and applicable to a case where another complex semiconductor in which a plurality of semiconductor chips are mounted on a package is used. In addition, the same reference numerals and characters are allotted to the common components in the drawings and descriptions thereof will not be repeated.

Figure 3:
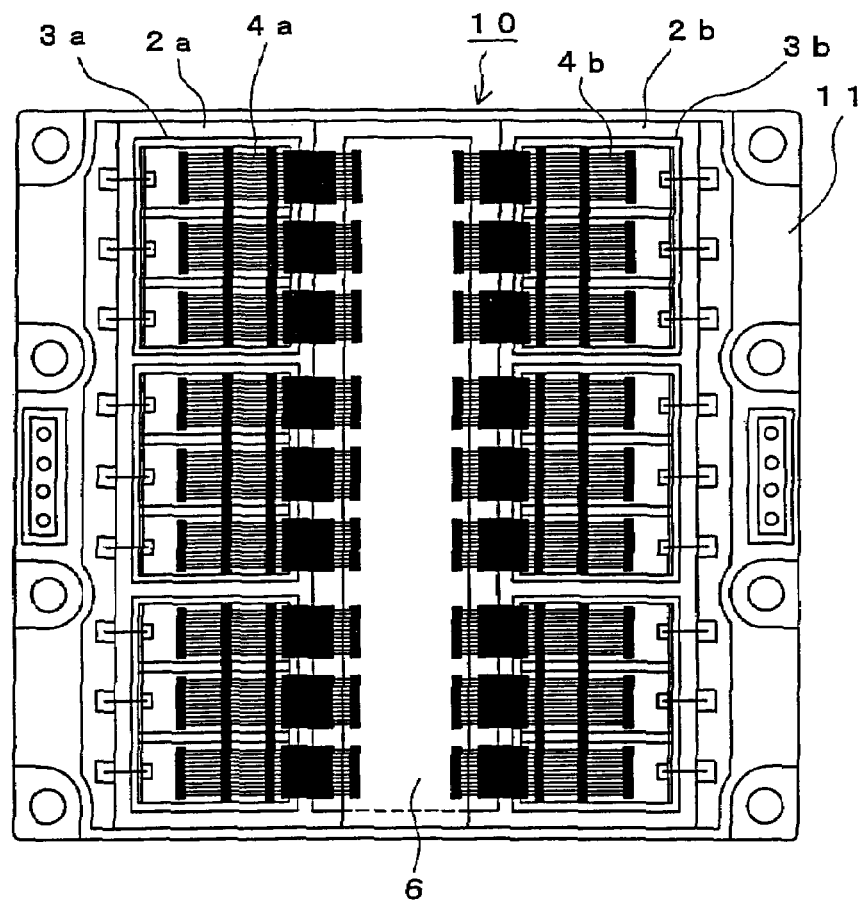
FIG. 3 is a plan view showing a conventional semiconductor power module.

FIG. 1 is a sectional view showing a semiconductor power module according to an embodiment 1 of the present invention. A semiconductor power module 1 shown in FIG. 1 has basically the same constitution as that of a conventional semiconductor power module 10 shown in FIGS. 3 and 4, and a significant difference between them is that a predetermined terminal position on each circuit pattern and an extending portion of an electrode terminal plate are connected by soldering to thereby reduce wire bondings in number.

Referring to the semiconductor power module 1 shown in FIG. 1, reference numerals 3a and 3b designate first and second circuit patterns laminated on a dye pad insulating substrate (see FIG. 3), respectively, and reference numeral 4a and 4b designate first and second semiconductor chips mounted on the circuit patterns 3a and 3b, respectively. More specifically, according to the illustrated constitution, the circuit patterns 3a and 3b are fixed to the surface of the insulating substrate and a plurality of semiconductor chips 4a and 4b are connected to the circuit patterns 3a and 3b by soldering or the like so as to be mounted thereon.

Reference numeral 6 designates a multilayer electrode plate assembly. The multilayer electrode plate assembly 6 includes first to third laminated electrode terminal plates 6a, 6b and 6c and insulating layers 7a, 7b and 7c alternately disposed just under them, respectively, which form a laminated structure. The three electrode terminal plates are insulated to each other by the insulating layers 7a, 7b and 7c. Reference numeral 21a and 21b designate metal wires functioning as first connecting conductor means (i.e., wire bonding). Furthermore, reference numerals 31a and 31b designate solders provided on the circuit patterns 3a and 3b to connect the extending portions of the electrode terminal plates 6b and 6c to the circuit patterns 3a and 3b, respectively, which is referred to as second connecting conductor means (i.e., soldering of the extending portions) in this description.

As shown in FIG. 1, the semiconductor chips 4a and 4b are arranged along a pair of opposite side lines of a quadrate metal base for cooling (referring to FIG. 3) which extends in a longitudinal direction. The multilayer electrode plate assembly 6 is disposed between the two arrays of the semiconductor chips 4a and 4b along the above pair of the opposite side lines.

FIG. 1 illustrates a side view showing a structure of the multilayer electrode plate assembly 6 and a configuration connecting the semiconductor chips 4a and 4b and each terminal of the semiconductor chips 4a and 4b and circuit patterns 3a and 3b to each of the three multilayer electrode terminal plates 6a, 6b and 6c.

More specifically, the electrode terminal plates 6a and 6b are electrically connected (wire bonded) to the semiconductor chips 4a and 4b by the wires 21a and 21b, respectively. Meanwhile, an extending portion 60b of the second electrode terminal plate 6b is electrically connected by soldering to the semiconductor chip 3a through the solder 31a, and similarly, an extending portion 60c of the third electrode terminal plate 6c is electrically connected by soldering to the semiconductor chip 3b through the solder 31b.

Thus, in the constitution shown in FIG. 1, the first and second electrode terminal plates 6a and 6b are electrically connected to the first and second semiconductor chips 4a and 4b through the wires 21a and 21b, respectively. The wires 21a and 21b function as a first connecting conductor means for connecting by wire bonding the electrodes of the semiconductor chips 4a and 4b to the electrode terminal plates 6a and 6b disposed at predetermined positions.

Figure 4:
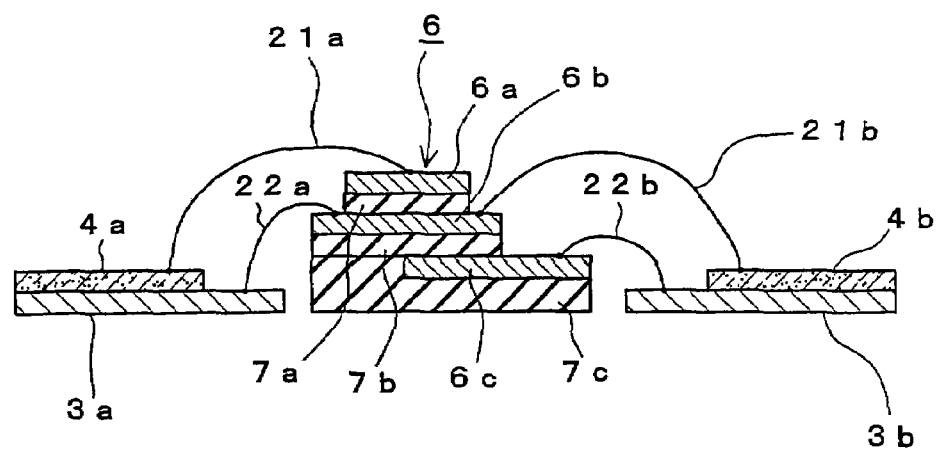
FIG. 4 is a partially side sectional view showing an inner structure of the semiconductor power module shown in FIG. 3.

According to the present embodiment, the circuit patterns 3a and 3b are connected (soldered) to the extending portions 60b and 60c of the electrode terminal plates 6b and 6c through the solders 31a and 31b, respectively, and thereby eliminating the conventional wire bonding using the wires 22a and 22b in the constitution shown in FIG. 4.

Thus, the first semiconductor chip 4a is electrically connected (soldered, that is, the second connecting conductor means) to the second electrode terminal plate 6b through the first circuit pattern 3a and the solder 31a. The second electrode terminal plate 6b is further electrically connected (wire bonded, that is, the first connecting conductor means) to the second semiconductor chip 4b through the wire 21b since the wire 21b is electrically connected to the opposite side across a center line of the electrode terminal plate 6b. The second semiconductor chip 4b is further electrically connected (soldered, that is, the second connecting conductor means) to the third electrode plate 6c through the second circuit pattern 3b and the solder 31b.

More specifically, in this embodiment, the second connecting conductor means for connecting the second electrode terminal plate 6b disposed lower than the first electrode terminal plate 6a to the first circuit pattern 3a is provided as the extending portion 60b which is integrally extended from a part of the second electrode terminal plate 6b. The extending portion 60b of the second electrode terminal plate 6b is provided under the wire 21a with a distance from the wire 21a such that at least a part of a projection thereof in the vertical direction to the insulating substrate overlaps with the wire 21a.

According to the above constitution of this embodiment, as compared with the conventional case where both first and second connecting conductor means includes the wire bonding (21a and 22a) shown in FIG. 4, since the extending portion 60b of the second electrode terminal plate 6b is soldered to the circuit pattern by the second connecting conductor, its constitution becomes accurate and stable. As a result, a defective product caused by a defective looping configuration of the wire bonding is considerably prevented from generating as compared with the conventional constitution.

In addition, since the first connecting conductor constitution of the wire bonding using the wire 21a and the second connecting conductor constitution for soldering the extending portion 60b of the second electrode terminal 6b and the circuit pattern can be adjacently provided, miniaturization in size of the semiconductor power module can be implemented. Furthermore, as compared with the conventional constitution in which both first and second connecting conductor constitutions are made by wire bonding 21a and 22a, productivity and connection reliability thereof can be improved, and superior effects can be obtained in practice.

Preferably, according to an embodiment 2 of the present invention, as shown in FIG. 1, a first connecting conductor is constituted by wire bonding by means of the wires 21a and 21b for connecting electrodes 4a and 4b of the first and second semiconductor chips to the first and second electrode terminals 6a and 6b. Meanwhile, for connecting the third electrode terminal 6c to the second circuit pattern 3b, the second connecting conductor is substantially constituted by integrally forming an extending portion 60c from a part of the third electrode terminal 6c and soldering (31b) the extending portion 60c to the second circuit pattern 3b.

Thus, since there are provided the first connecting conductor of the wire bonding by the wires 21a and 21b and the second connecting conductor having the extending portion 60c extended from a part of the third electrode terminal 6c, wire bonding points of the electrode terminals are reduced (there is no 22b) and a high precision region on a connection face of the third electrode terminal 6c can be reduced in comparison with the conventional constitution (21b and 22b) shown in FIG. 4 in which the first and second connecting conductors are comprised of the wire bonding. As a result, there can be obtained effects that productivity of the electrode terminal is improved and costs can be reduced.

Preferably, according to an embodiment 3 of the present invention, as shown in FIG. 1, the extending portions 60b and 60c of the second and third electrode terminal plates 6b and 6c may be configured to have extending portions 61b and 61c in the horizontal direction, and bending portions 62b and 62c bending toward the circuit patterns 3a and 3b in the vertical direction and the ends of the bending portions 62a and 62c are connected to the circuit patterns 3a and 3b by soldering 31a and 31b, respectively.

Thus, the electrode terminal plates (6b and 6c) and the circuit patterns (3a and 3b) can be easily disposed apart from each other in the height direction with a is predetermined distance by setting the length of the bending portions 62b and 62c at a predetermined length.

Figure 2A:
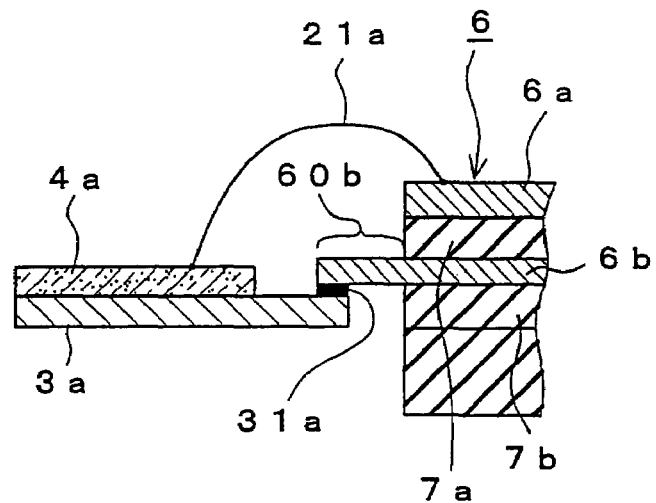
Figure 2B:
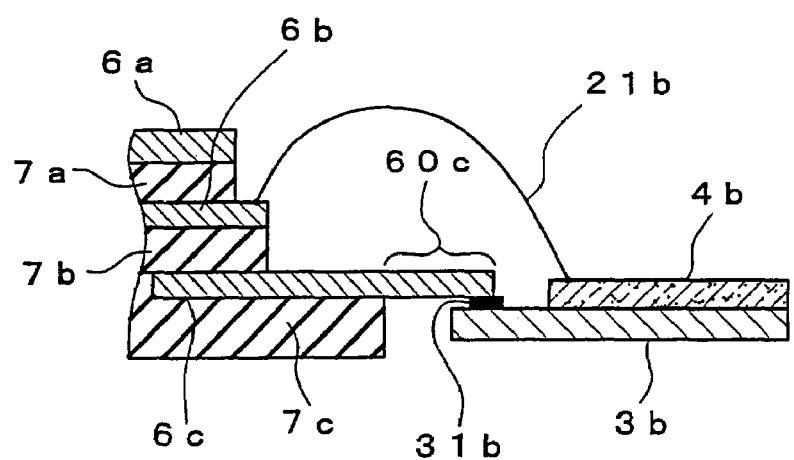

Preferably, according to an embodiment 4 of the present invention, as shown in FIGS. 2A and 2B, the extending portions 60b and 60c of the second and third electrode terminal plates 6b and 6c are constituted by only the extending portions in the horizontal direction without providing a bending portion. Thus, the extending portions 60b and 60c linearly extend with the same thickness as that of the second and third electrode terminal plates 6b and 6c and predetermined portions of backsides thereof are connected to the circuit patterns 3a and 3b by soldering 31a and 31b.

Thus, since the shapes of the electrode terminals 6b and 6c are simple flat plates, there can be provided an electric power semiconductor device with superior productivity and low cost.

It is noted that, in the embodiments 1 to 4 of the present invention, although the description is made of the case where the semiconductor chips 4a and 4b are arranged along a pair of opposite side lines of a quadrate metal base for cooling which extends in a longitudinal direction and the multilayer electrode plate assembly 6 is disposed between the two arrays of the semiconductor chips 4a and 4b along the above pair of the opposite side lines, the present invention is not limited to this. For example, there may be provided another constitution in which the electrode terminal plate is strap-shaped, a plurality of electric power semiconductor chips are provided on only one side of the electrode terminal plate and a wire bonding surface is provided on only one side of the electrode terminal plate.

Thus, since the wire bonding region of the strap-shaped electrode terminal is linear, there can be provided the electric power semiconductor device in which processing for the terminal is simple and workability of the wire bonding and the soldering connection at the electrode plate extending portion is extremely excellent.

As described above, the following effects can be obtained by the present invention. That is, according to the first aspect of the present invention, as compared with the case where the first and second connecting conductors both include wire bonding, since the configuration of the second connecting conductor becomes accurate and stable, a defective product caused by a defective looping configuration of the wire bonding with the second connecting conductor is considerably prevented from generation as compared with the conventional constitution. In addition, since the first connecting conductor and the second connecting conductor can be adjacently provided, miniaturization can be implemented. Furthermore, as compared with the conventional constitution in which both first and second connecting conductors are wire bonding, productivity and connection reliability thereof can be improved, whereby superior effects can be provided in practice.

According to the second aspect of the present invention, as compared with the constitution in which the first and second connecting conductors comprise the wire bonding, since the wire bonding points of the electrode terminals are reduced and a high precision region on a connection face of the electrode terminal can be reduced. As a result, there can be provided effects that productivity of the electrode terminal is improved and costs can be reduced.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. An electric power semiconductor device comprising:
   first and second circuit patterns formed on main surfaces of first and second insulating substrates, respectively;
   first and second semiconductor chips mounted on the first and second circuit patterns, respectively;
   a multilayer electrode plate assembly disposed between the first and second insulating substrates, having first, second and third electrode terminals provided with a distance from each other;
   a first connecting conductor made by wire bonding for connecting the first and second semiconductor chips to the first and second electrode terminals;
   a second connecting conductor having an extending portion extended from a part of the third electrode terminal to be connected to the second circuit pattern; and
   a third connecting conductor having an extending portion extended from a part of the second electrode terminal to be connected to the first circuit pattern,
   wherein the connection between the extending portions of the second and third electrode terminals with the first and second circuit patterns, respectively, is implemented by a solder, and
   wherein the extending portion of the second electrode terminal has a horizontally extending portion and a bending portion downwardly bending in the vertical direction toward the first circuit pattern, and the end of the bending portion is connected to the first circuit pattern by solder, and
   the extending portion of the third electrode terminal has a horizontally extending portion and a bending portion downwardly bending in the vertical direction toward the second circuit pattern, and the end of the bending portion is connected to the second circuit pattern by solder.

2. The electric power semiconductor device according to claim 1, wherein each of the electrode terminals is strap-shaped, and a plurality of semiconductor chips are provided on one side of the electrode terminals and a wire bonding portion is provided on only one surface side of the electrode terminals.

3. The electric power semiconductor device according to claim 1, wherein the bending portion of the second electrode terminal and the third electrode terminal have different lengths, such that a lower surface of the bending portion of the second electrode terminal, and a lower surface of the bending portion of the third electrode terminal are arranged at a same level in the vertical direction.

4. The electric power semiconductor device according to claim 1, wherein an opposite end of the third electrode terminal opposite to the extending portion is covered by insulating layers.

* * * * *